United States Patent [19]

Molinaro

[11] Patent Number: 4,762,353

[45] Date of Patent: Aug. 9, 1988

[54] FLEXIBLE CARRIER FOR SEMICONDUCTOR WAFER CASSETTES

[75] Inventor: James S. Molinaro, Whitehall, Pa.

[73] Assignee: Dexon, Inc., Minneapolis, Minn.

[21] Appl. No.: 23,194

[22] Filed: Mar. 9, 1987

[51] Int. Cl.⁴ .............................................. B65D 71/00
[52] U.S. Cl. ........................................ 294/1.1; 294/32; 294/67.1; 294/146; 294/159; 901/30
[58] Field of Search ........................ 294/26.5, 27.1, 32, 294/67.1, 87.1, 90, 91, 141–144, 146, 159, 162–164, 167, 169, 172, 1.1; 118/500; 206/454–456, 557, 564; 211/40, 41, 126; 901/30, 50

[56] References Cited

U.S. PATENT DOCUMENTS

| | | | |
|---|---|---|---|
| 1,267,810 | 5/1918 | Singleton | 294/169 |
| 1,501,812 | 7/1924 | Schulz | 294/144 X |
| 1,630,471 | 5/1927 | Collins | 294/144 X |
| 2,027,032 | 1/1936 | Farr | 294/169 |
| 3,167,211 | 1/1965 | McCormick | 294/159 X |
| 3,233,804 | 2/1966 | Dahm | 294/162 X |
| 3,939,973 | 2/1976 | Wallestad | 294/27.1 X |
| 4,235,331 | 11/1980 | Bates et al. | 294/169 X |
| 4,657,295 | 4/1987 | Holem | 294/162 |

FOREIGN PATENT DOCUMENTS 15791 of 1906 United Kingdom ............... 294/159

Primary Examiner—Johnny D. Cherry
Attorney, Agent, or Firm—Hugh D. Jaeger

[57] ABSTRACT

An apparatus for holding and transporting semiconductor material cassettes during processing of the semiconductor material. There is a tray having at least one cassette station thereon. This cassette station comprises a cassette supporting surface, a first pair of substantially parallel cassette guides on the supporting surface, and a second pair of substantially parallel cassette guides on the supporting surface located between and substantially at right angles to the first pair. The first and second pairs of parallel cassette guides form a generally rectangular boundary. A handle neck extends upwardly from the same side of the tray as the cassette guides. A handle crosspiece is connected to the handle neck and has a bearing surface oriented substantially parallel to the plane of the tray. A picker is also disclosed for engaging the handle neck and handle crosspiece, and can be used as the end effector of a robot arm that provides lifting power and transport motion.

8 Claims, 6 Drawing Sheets

FLEXIBLE CARRIER FOR SEMICONDUCTOR WAFER CASSETTES

BACKGROUND OF THE INVENTION

1. Field of the Invention

This invention relates to apparatus used in the processing of semiconductor wafers. More particularly, it relates to apparatus for transporting cassettes holding multiple semiconductor wafers that can be used in the automated processing of semiconductor wafers through a sequence of operations in which the wafer cassettes must be transported from one processing station to another.

2. Description of the Prior Art

The handling and storage of thin, delicate wafers for the semiconductor industry present difficult problems because of the high value of such wafers and their fragility. The wafers may be of very brittle material, such as silcon, and are usually three to six inches in diameter but only a few thousandths of an inch thick.

The processing of such wafers usually requires them to be successively bathed in and drained free of liquids, sometimes at elevated temperatures. They may also be dried, placed in an epitaxial reactor or diffusion furnace or merely transported from one location to another. In the past few years it has become common to use cassettes in the form of small baskets or racks of a size suitable to accommodate an array of wafers of a particular size to carry or store the batch of wafers during processing or transport. During processing, the cassettes together with their wafers are usually successively immersed in baths of liquids or used at other wafer batch processing stations performing other operations previously mentioned.

Several factors make it desirable to provide automation in the processing of cassettes of semiconductor wafers. First, the wafers must be processed in extremely, dust-free environments in order to achieve high yields. The hair, skin and clothing of human beings necessarily release particulate matter that can cause problems at the microscopic level in semiconductors. Second, the processing of semiconductor wafers sometimes involves hazardous or unpleasant chemicals or other environments to which human beings should not be exposed for prolonged periods. Third, the timing of certain processing operations is critical. Automated equipment is superior to human labor for repetitive sequences of time-critical operations. However, even automated equipment must be carefully designed to represent an improvement over human labor. For example, parts that move against each other can be a source of dust or particulate matter. It is also desirable to avoid direct automated or manual contact with the cassettes themselves, as this can lead to chipping, breaking or contamination of the semiconductor wafers in the cassettes.

While the semiconductor industry has developed certain standards relating to the dimensions, wafer capacity and other characteristics of the cassettes used to hold semiconductor wafers, present cassette designs (e.g., U.S. Pat. Nos. 3,923,156 and 3,961,877) do not lend themselves easily to interfacing with robotics equipment. Robotic handling equipment working with the delicacy and dexterity of the human hand is now possible in some circumstances, but such equipment is extremely expensive. Accordingly, what has been needed in the prior art is apparatus that aids in the use of automated equipment for handling cassettes that hold semiconductor wafers (or other similar semiconductor materials) during their processing. Such equipment will have the widest usefulness when it can interface with relatively inexpensive robotic devices and when it can serve as the interface for all manual or automated handling of cassettes, so that direct manual or automated handling of cassettes (which can lead to chipping, breaking or contamination of wafers) is avoided.

SUMMARY OF THE INVENTION

The present invention is an apparatus for holding and transporting semiconductor material cassettes during processing of the semiconductor material. In the apparatus there is a tray having at least one cassette station thereon. This cassette station comprises a cassette supporting surface, a first pair of substantially parallel cassette guides on the supporting surface and a second pair of substantially parallel cassette guides on the supporting surface located between and substantially at right angles to the first pair. The first and second pairs of parallel cassette guides form a generally rectangular boundary. A handle neck extends upwardly from the same side of the tray as the cassette guides. A handle crosspiece is connected to the handle neck and has a bearing surface oriented substantially parallel to the plane of the tray.

It is an objective of the invention to provide a carriage for conveniently holding one or more semiconductor material cassettes during processing.

It is another objective of the invention to provide a carriage for holding semiconductor material cassettes that is easily grasped or engaged by automated equipment.

It is a further objective of the invention to provide a carriage for transporting semiconductor material cassettes in which engagement of the handle of the tray by the end effector of a robot arm occurs without requiring any moving parts in either the end effector on the robot arm or the handle of the apparatus.

It is an additional objective of the invention to provide a carriage that is flexible in that it can accommodate several standard sizes of semiconductor material cassettes.

It is a still further objective of the invention to provide a carriage for transporting semiconductor material cassettes that permits such cassettes to be transported by automated equipment or manually without direct physical contact with the cassettes by such automated equipment or hands.

These and other objects of the invention will become more apparent in the following detailed description of the invention.

DESCRIPTION OF THE PREFERRED EMBODIMENT

Figure 1:
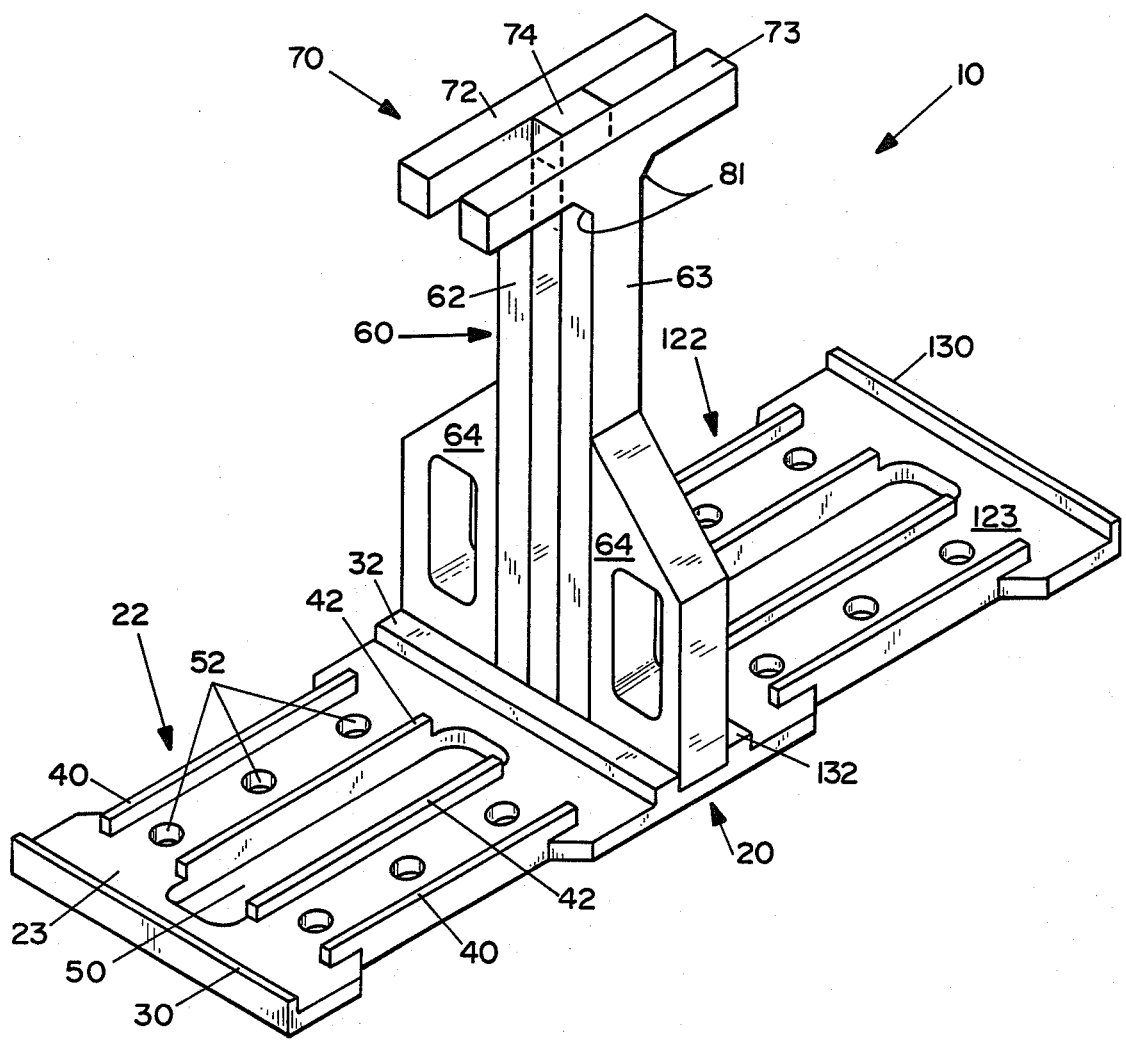
FIG. 1 is an isometric pictorial view of the carriage of the present invention.

As may be seen in FIG. 1, the carriage 10 of the present invention generally comprises a horizontal tray 20 to which is connected a handle neck 60 extending vertically upward from the center of the tray 20. A handle crosspiece 70 is attached to the upper end of the handle neck 60. The tray 20 incorporates at least one, preferably two wafer cassette stations, shown at 22 and 122 in FIG. 1. In the preferred embodiment, each of these wafer cassette stations 22, and 122 have the same structure and each is able to accommodate cassettes of various sizes that carry semiconductor materials such as silicon wafers. In the following, wafer cassette station 22 will be described. Its structure is symmetrically identical to that of wafer cassette station 122. This symmetry is indicated by comparable drawing numbers, e.g., support surface 23 at wafer cassette station 22 corresponding to support surface 123 at wafer cassette station 122.

Wafer cassette station 22 comprises a support surface 23 that is generally rectangular and bounded by a pair of parallel transverse cassette guides, exterior cassette guide 30 and interior cassette guide 32. Oriented at right angles to the transverse cassette guides 30 and, 32 is a pair of outer longitudinal cassette guides 40, 40 recessed slightly from the outer longitudinal edges of the tray 20. Located parallel to and between the outer longitudinal cassette guides 40, 40 is a pair of inner longitudinal cassette guides 42, 42.

Because the carriage 10 is to be used in connection with processing steps involving liquids, drainage of the wafer cassette station 22 is provided by an elongated opening 50 in the center of the support surface 23, as well as smaller drainholes 52 located in rows between the inner longitudinal cassette guides 42, 42 and the outer longitudinal cassette guides 40, 40. These openings also help reduce the weight of the carriage 10, thereby decreasing demands on any automated equipment that must lift or move the carriage 10.

The handle neck 60 extending vertically upward from the center of the tray 20 is formed by a pair of parallel neck members 62, and 63 in spaced relation to each other. These are attached to the tray 20 by screws or other suitable fasteners (not shown), made preferably from the same material as the tray 20. A buttress 64 is attached to each of the neck members 62, and 63 for additional support of the neck members 62, and 63. The buttresses 64, 64 are connected to the tray 20 in a manner similar to the neck members 62, and 63. Each buttress 64 has an opening through it to reduce weight.

At the upper end of the neck members 62, and 63 is a handle crosspiece 70. This consists of a pair of crossbars 72, and 73 with a spacer 74 located between them. The crossbars 72, and 73 are preferably molded as part of the respective handle neck members 62, and 63 to which they are connected. This facilitates the introduction of fillets 81, 81 located at the right angle connection points between handle neck member 63 and its corresponding crossbar 73, as well as between handle neck member 62 and its corresponding crossbar 72 (the latter fillets are not visible in FIG. 1). Spacer 74 is held in position by a suitable fastener, made preferably from the same material as the tray 20 and neck members 62, and 63.

Figure 4:
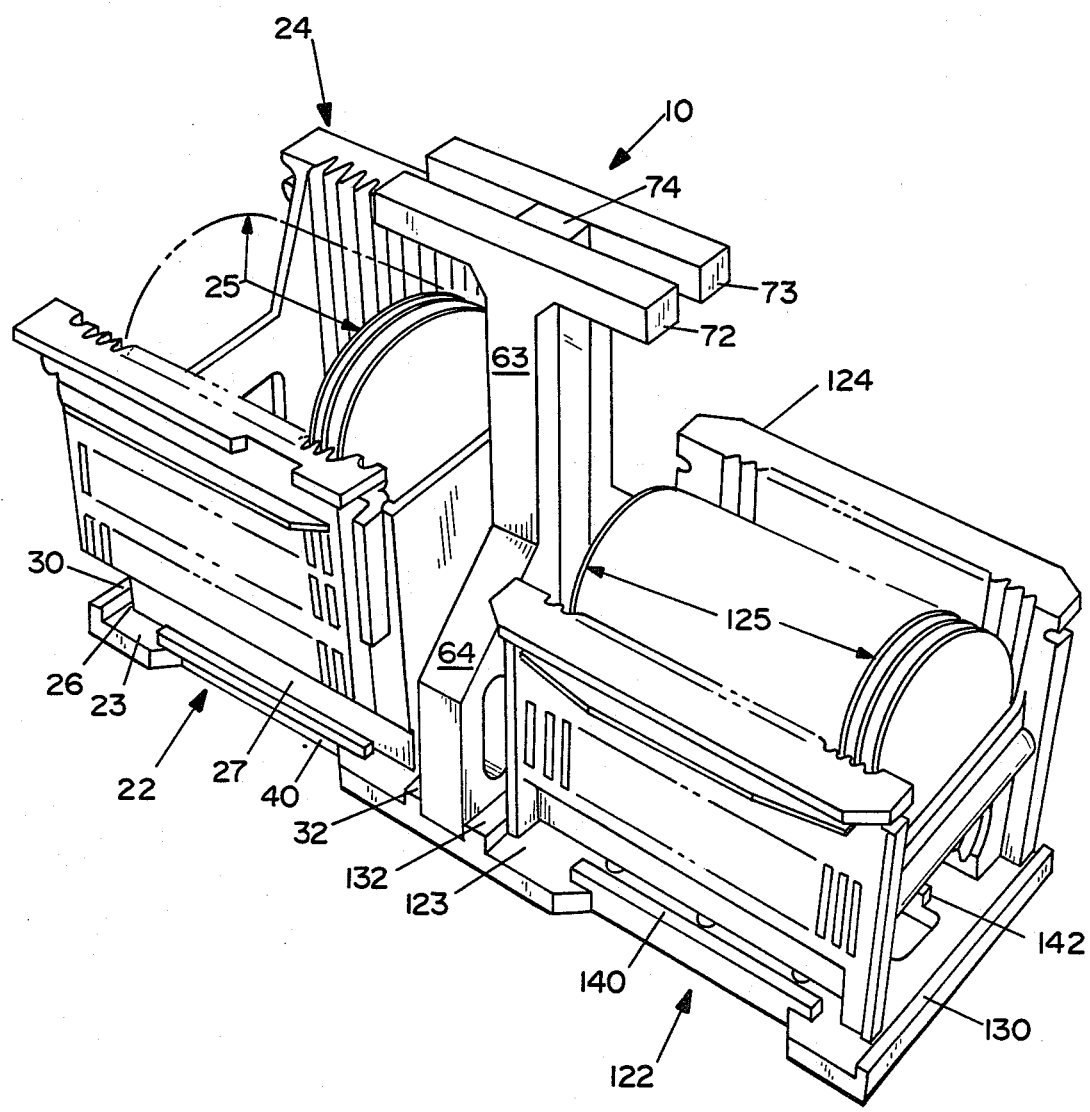
FIG. 4 is a perspective view of the carriage of the invention with two semiconductor material cassettes of different sizes placed on the supporting surfaces with some parts shown in phantom dashed lines.

As best seen in FIG. 4, each of the wafer cassette stations 22, 122 can accommodate a wafer cassette, such as large wafer cassette 24 shown in FIG. 4 at cassette station 22 or smaller wafer cassette 124 shown at cassette station 122. The wafer cassettes 24, and 124 come in a variety of standard sizes as described in "Book of Semi Standards 1985", published by Semiconductor Equipment and Materials Institute, Incorporated, Mountain View, Calif. These standards describe three-inch, four-inch, five-inch and six-inch wafer carriers or cassettes, named for the nominal size of the wafers accommodated by the cassettes. In FIG. 4, large wafers 25 are shown in large wafer cassette 24, while smaller wafers 125 are shown in smaller wafer cassette 124. The supporting surfaces 23, and 123 are sized so that they can accommodate more than one cassette size; preferably, they can handle three-inch, four-inch, five-inch and six-inch wafer cassettes.

As best seen at cassette station 22 in FIG. 4, the side wall 27 and the end wall 26 of the base of the wafer cassette 24 are confined by the outer longitudinal cassette guides 40, 40 and the outer and inner transverse cassette guides 30, and 32, respectively. In the case of a larger wafer cassette 24, the base of the cassette 24 occupies most of the supporting surface 23 and there is little room for lateral or longitudinal motion of the cassette 24. If such motion occurs, it is limited by the presence of the various cassette guides. The inner transverse cassette guide 32 maintains the cassette 24 in spaced relation to the handle cross piece 70 and buttresses 64, 64 so that both the inner and the outer ends of the cassette 24 may be grasped by hand or by automated equipment.

FIG. 4 shows the manner in which a smaller wafer cassette 124 is also confined by outer and inner transverse cassette guides 130, and 132 and outer longitudinal cassette guides 140, 140, although a greater portion of the supporting surface 123 is left exposed. In the case of a smaller wafer cassette 124, the presence of the inner longitudinal cassette guides 142, 142 also aids stable holding of the wafer cassette 124, as these limit skewing of the wafer cassette 124 to the extent that it has freedom to rotate on the support surface 123.

Figure 2:
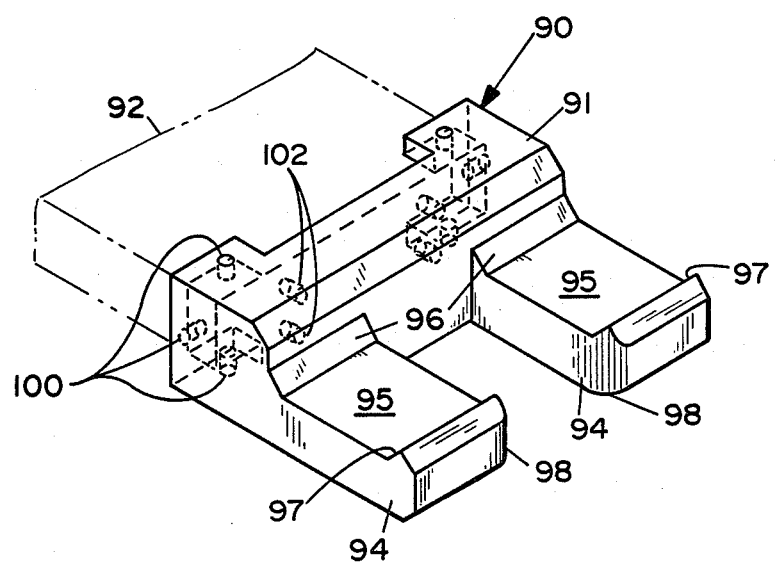
FIG. 2 is an isometric pictorial view of the picker means used with the carriage of the present invention, with part of a robot arm shown in phantom dashed lines.
Figure 3A:
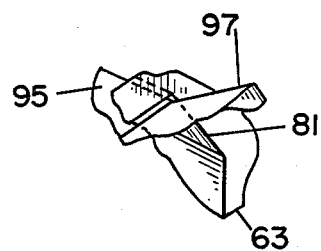
FIG. 3a is a detailed pictorial view very greatly enlarged showing contact points between the picker means and carriage handle, taken from the area encircled by 3a in FIG. 3.
Figure 3:
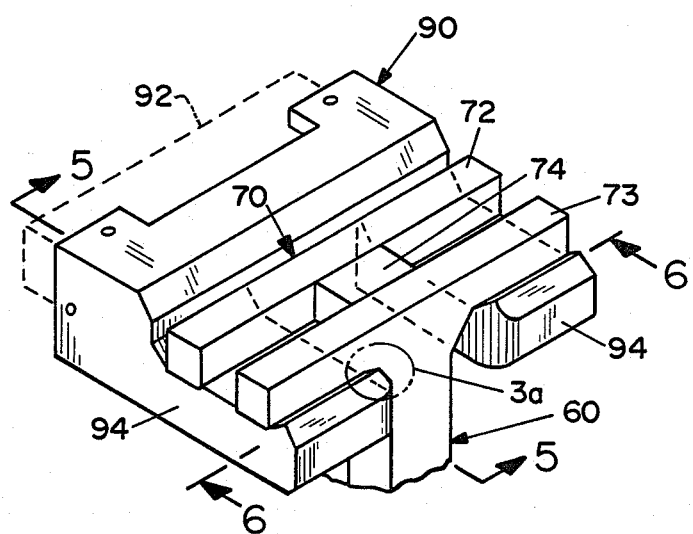
FIG. 3 is a partial isometric view of the upper part of the carriage with the carriage handle and the picker means shown engaged.

Turning now to FIGS. 2, 3, 3a, 5 and 6, the manner in which the handle crosspiece 70 and handle neck 60 are engaged or grasped by automated equipment is described. FIG. 2 shows a picker 90 used as the end effector of a robot arm 92. The picker 90 includes a picker mount 91 that has clamping set screws 100 and alignment abutment screws 102 at either end for attachment to and alignment on the robot arm 92. Extending from the picker mount 91 is a pair of lift fingers 94. Each of these has an upper face 95 with sloping sides 96, and 97 forming a capture groove. In addition, the interior leading surface of each lift finger 94 includes a rounded corner 98.

Figure 5:
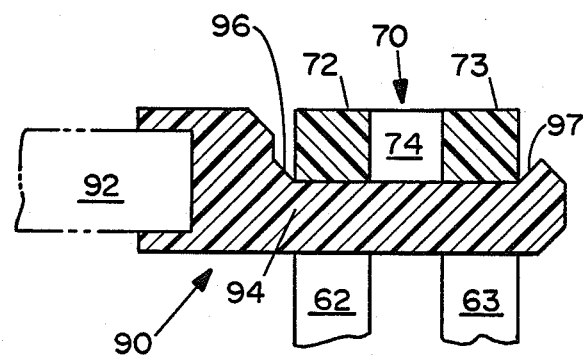
FIG. 5 is a sectional elevation taken along line 5—5 of FIG. 3.
Figure 6:
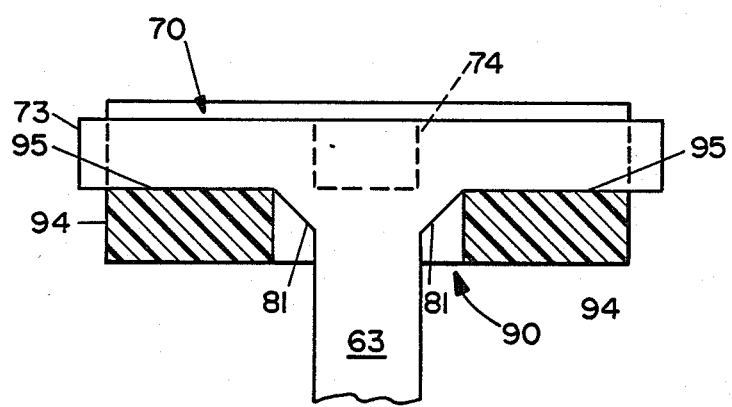
FIG. 6 is a sectional elevation taken along line 6—6 of FIG. 3.

Turning specifically to FIGS. 3, 3a, 5 and 6, the engagement relationship between the picker 90 and the handle neck 60 together with the handle crosspiece 70 can be seen. The lift fingers 94 of the picker 90 straddle the handle neck 60 with the lift fingers 94 oriented at right angles to the handle crosspiece 70. The sloping sides 96, and 97 associated with the upper face 95 of each finger 94 help to guide the handle crossbars 72, and 73 into stable engagement with the upper faces 95 of the fingers 94. Centering of the handle neck 60 between the lift fingers 94 is initially facilitated by the rounded corners 98 and later by the fillets 81 on either side of the handle neck 60. FIGS. 5 and 6 show the final engaged position of the picker 90 and the handle neck 60 and handle crosspiece 70. In this position, there is stable, surface-to-surface contact between the upper faces 95 of the lift fingers 94 meeting the lower surfaces of the crossbars 72, and 73. Also, the outer edges of the fillets 81 of handle neck members 62, and 63 are engaged by the internal upper edges of the lift fingers 94. Because the lower surfaces of the crossbars 72, and 73 are substantially parallel to the plane of the tray 20, when upper surfaces 95, 95 of the fingers 94, 94 are horizontal, the tray 20 is held horizontal. In this position, the picker 90, driven by the robot arm 92, can lift and move the carriage 10. To the extent that lifting or other motion causes movement of the carried wafer cassettes 24 or 124, this movement is limited by the various cassette guides discussed above. The crossbar structure with flat engagement surfaces also reduces possible adverse effects from wafer cassettes of unequal weight.

The carriage 10 of the present invention is preferably made from a temperature-resistant plastic such as "Teflon PFA," a perfluoroalkoxy-substituted polytetrafluoroethylene resin, molded in two or more pieces and connected by fasteners made of the same material. Alternatively, for certain designs the entire carriage 10 could be molded as a unit.

In summary, it will be seen from the above that the present invention comprises an apparatus useful for the transport of semiconductor wafer cassettes during processing. The wafer cassettes are stably held and confined at one or more wafer cassette stations 22, or 122 on a tray 20. The handle neck 60 and handle crosspiece 70 of the carriage 10 can be engaged by a picker 90 that has no moving parts that open or close for engagement. Because of its own construction and the complementary construction of the handle neck and handle crosspiece, the picker 90 will center itself into stable engagement even if the robot is not precise in its approach to the carriage 10. The carriage is flexible because it can hold different sizes of wafer cassettes, including more than one size at once.

While a preferred embodiment of the invention has been illustrated and described, it is to be understood that the invention is not limited to the precise apparatus herein disclosed, and the right is reserved to all variations coming within the scope of the appended claims. For example, it will be clear that the invention could involve support surfaces of varying shapes and various different constructions for the handle neck and handle crosspiece. Designs with a single cassette station or more than two cassette stations are also possible. In addition, in the embodiment shown material could be removed from a variety of other members to facilitate drainage and/or to reduce the total weight of the carriage. Finally, while a preferred material for the carriage has been specified, other materials suitable for the work environment and the required degree of rigidity can be found.

What is claimed as new and desired to be protected by Letters Patent is:

1. Apparatus for transporting semiconductor material cassettes during processing, comprising:
   (a) a tray having two wafer cassette stations thereon, said cassette station comprising:
      a cassette supporting surface;
      a first pair of substantially parallel cassette guides on said supporting surface; and,
      a second pair of substantially parallel cassette guides on said supporting surface located between and substantially at right angles to said first pair to form a generally rectangular boundary, said stations are approximately equal in size;
   b. a handle neck extending upwardly from the same side of the tray as the cassette guides and between said stations, and located in a plane that intersects and is perpendicular to said tray;
   c. a handle crosspiece connected to the handle neck and having a bearing surface oriented substantially parallel to the plane of said parallel wafer cassette guides and said tray and,
   d. picker means for engaging the handle neck and handle crosspiece, said picker means having a pair of substantially parallel fingers separated by a distance slightly larger than the width of said neck and said fingers having in them substantially parallel transverse grooves slightly wider than the width of said handle crosspiece; and, at least one fillet located between the handle neck and handle crosspiece, whereby when the fingers of the picker means straddle the handle neck and approach the handle crosspiece for engaging and lifting the apparatus, the fillet guides the picker means and the handle neck and handle crosspiece into the desired engagement relationship with each other.

2. The apparatus of claim 1 wherein said tray further comprises a third pair of parallel wafer cassette guides on said tray located parallel to and between one of said first and second pairs.

3. The apparatus of claim 1 wherein the parallel grooves of the fingers have sloped, parallel sides that slope outward and upward from the groove bottom surfaces, whereby when the fingers of the picker means straddle the handle neck and the grooves approach the handle crosspiece, the sloped parallel sides guide the picker means and the crosspiece into the desired engagement relationship with each other.

4. The apparatus of claim 1 wherein the supporting surface of each wafer cassette station is large enough to accommodate wafer cassettes of more than one standard size.

5. The apparatus of claim 1 wherein the tray has one or more openings therethrough for drainage of liquids introduced in processing the semiconductor material with liquids.

6. The apparatus of claim 1 wherein the handle neck is rigidly connected to the tray by means of buttresses at the connection point between the handle neck and the tray.

7. The apparatus of claim 6 wherein each guide of one of said first or second pair of cassette guides is oriented parallel to the plane of the handle neck and its buttresses and the guide nearest to the handle neck and its buttresses is in spaced relation to the plane of the handle neck and its buttresses.

8. The apparatus of claim 1 wherein the cassette supporting surface is large enough to accommodate wafer cassettes of more than one standard size.

* * * * *